(12) United States Patent
Zhu et al.

(10) Patent No.: US 10,446,571 B2
(45) Date of Patent: Oct. 15, 2019

(54) MEMORY CIRCUITRY COMPRISING A VERTICAL STRING OF MEMORY CELLS AND A CONDUCTIVE VIA AND METHOD USED IN FORMING A VERTICAL STRING OF MEMORY CELLS AND A CONDUCTIVE VIA

(71) Applicant: Micron Technology, Inc., Boise, ID (US)

(72) Inventors: Hongbin Zhu, Boise, ID (US); Gurtej S. Sandhu, Boise, ID (US); Kunal R. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 195 days.

(21) Appl. No.: 15/170,114

(22) Filed: Jun. 1, 2016

(65) Prior Publication Data
US 2017/0352677 A1 Dec. 7, 2017

(51) Int. Cl.
  *H01L 27/11582* (2017.01)
  *H01L 27/105* (2006.01)
  (Continued)

(52) U.S. Cl.
  CPC .... *H01L 27/11582* (2013.01); *H01L 27/1052* (2013.01); *H01L 27/1157* (2013.01);
  (Continued)

(58) Field of Classification Search
  CPC .......... H01L 21/8221; H01L 27/11578; H01L 27/1158; H01L 27/11582; H01L 27/11551;
  (Continued)

(56) References Cited

U.S. PATENT DOCUMENTS

| 7,867,831 B2 | 1/2011 | Shin et al. |
| 7,898,850 B2 | 3/2011 | Min et al. |

(Continued)

FOREIGN PATENT DOCUMENTS

| KR | 10-2009-0069936 | 7/2009 |
| KR | 10-2009-0123481 | 12/2009 |

(Continued)

OTHER PUBLICATIONS

U.S. Appl. No. 14/830,517, filed Aug. 19, 2015, Dorhout et al.
(Continued)

*Primary Examiner* — Jesse Y Miyoshi
(74) *Attorney, Agent, or Firm* — Wells St. John P.S.

(57) ABSTRACT

A method used in forming a vertical string of memory cells and a conductive via comprises forming a first lower opening and a second lower opening into a lower material. A first material is formed within the first and second lower openings. An upper material is formed above the lower material and above the first material in the first and second lower openings. A first upper opening is formed through the upper material to the first material in the first lower opening. At least a majority of the first material is removed from the first lower opening through the first upper opening and channel material is formed within the first lower and first upper openings for the vertical string of memory cells being formed. After forming the channel material, a second upper opening is formed through the upper material to the first material in the second lower opening. Conductive material of the conductive via is formed within the second upper opening. Structure embodiments independent of method of formation are disclosed.

12 Claims, 12 Drawing Sheets

(51) Int. Cl.
*H01L 27/1157* (2017.01)
*H01L 27/11521* (2017.01)
*H01L 27/11556* (2017.01)
*H01L 27/11568* (2017.01)
*H01L 27/11573* (2017.01)

(52) U.S. Cl.
CPC .. *H01L 27/11521* (2013.01); *H01L 27/11556* (2013.01); *H01L 27/11568* (2013.01); *H01L 27/11573* (2013.01)

(58) Field of Classification Search
CPC ......... H01L 27/11553; H01L 27/11556; H01L 27/11514; H01L 23/5226; H01L 27/1052; H01L 27/1157

See application file for complete search history.

(56) References Cited

U.S. PATENT DOCUMENTS

| | | | |
|---|---|---|---|
| 8,697,498 B2 | 4/2014 | Jang et al. | |
| 2012/0003800 A1 | 1/2012 | Lee et al. | |
| 2012/0276719 A1* | 11/2012 | Han | H01L 27/11582 438/478 |
| 2013/0109157 A1 | 5/2013 | Kito et al. | |
| 2015/0076585 A1 | 3/2015 | Pachamuthu et al. | |
| 2015/0236038 A1* | 8/2015 | Pachamuthu | H01L 27/11582 257/326 |
| 2015/0279855 A1 | 10/2015 | Lu et al. | |
| 2017/0062454 A1* | 3/2017 | Lu | H01L 21/76877 |
| 2017/0345843 A1* | 11/2017 | Lee | H01L 23/5226 |

FOREIGN PATENT DOCUMENTS

| | | |
|---|---|---|
| WO | WO PCT/US2017/032631 | 7/2017 |
| WO | WO PCT/US2017/032631 | 12/2018 |

OTHER PUBLICATIONS

U.S. Appl. No. 15/130,803, filed Apr. 15, 2016, Huang et al.

Jang et al.; Vertical Cell Array using TCAT(Terabit Cell Array Transistor) Technology for Ultra High Density NAND Flash Memory; 2009 Symposium on VLSI Technology Digest of Technical Papers; 2009; pp. 192-193.

* cited by examiner

US 10,446,571 B2

MEMORY CIRCUITRY COMPRISING A VERTICAL STRING OF MEMORY CELLS AND A CONDUCTIVE VIA AND METHOD USED IN FORMING A VERTICAL STRING OF MEMORY CELLS AND A CONDUCTIVE VIA

TECHNICAL FIELD

Embodiments disclosed herein pertain to memory circuitry comprising a vertical string of memory cells and a conductive via and to methods used in forming a vertical string of memory cells and a conductive via.

BACKGROUND

Memory provides data storage for electronic systems. Flash memory is one type of memory, and has numerous uses in computers and other devices. For instance, personal computers may have BIOS stored on a flash memory chip. As another example, flash memory is used in solid state drives to replace spinning hard drives. As yet another example, flash memory is used in wireless electronic devices as it enables manufacturers to support new communication protocols as they become standardized, and to provide the ability to remotely upgrade the devices for improved or enhanced features.

A typical flash memory comprises a memory array that includes a large number of memory cells arranged in row and column fashion. The flash memory may be erased and reprogrammed in blocks. NAND may be a basic architecture of flash memory. A NAND cell unit comprises at least one selecting device coupled in series to a serial combination of memory cells (with the serial combination commonly being referred to as a NAND string). Example NAND architecture is described in U.S. Pat. No. 7,898,850.

Memory cell strings may be arranged to extend horizontally or vertically. Vertical memory cell strings reduce horizontal area of a substrate occupied by the memory cells in comparison to horizontally extending memory cell strings, albeit typically at the expense of increased vertical thickness. At least some conductive vias of the memory circuitry may need to extend through the increased vertical thickness, for example for connection with control circuitry whether laterally adjacent or under an array of the memory cell strings. Formation of such conductive vias can be problematic due to high aspect ratios (i.e, maximum vertical thickness to minimum horizontal thickness) of such conductive vias.

DETAILED DESCRIPTION OF EXAMPLE EMBODIMENTS

Embodiments of the invention encompass methods used in forming a vertical string of memory cells and a conductive via, and memory circuitry comprising a vertical string of memory cells and a conductive via independent of method of manufacture. In this document, "horizontal" refers to a general direction (i.e., within 10 degrees) along a primary surface relative to which a substrate is processed during fabrication, and "vertical" is a direction generally orthogonal thereto. Further, "vertical" and "horizontal" as used herein are generally perpendicular directions relative one another independent of orientation of the substrate in three-dimensional space. Further in this document, "elevational", "higher", "upper", "lower", "top", "atop", "bottom", "above", "below", "under", and "beneath" are generally with reference to the vertical direction relative to a base substrate upon which the circuitry is fabricated. Example method embodiments in accordance with the invention are initially described with reference to FIGS. 1-11. The example method embodiments are described relative to what may be commonly referred to as "gate last" or "replacement gate" processing and finished construction, although any alternate processing (e.g., "gate first") and finished circuitry construction may be used.

Figure 1:
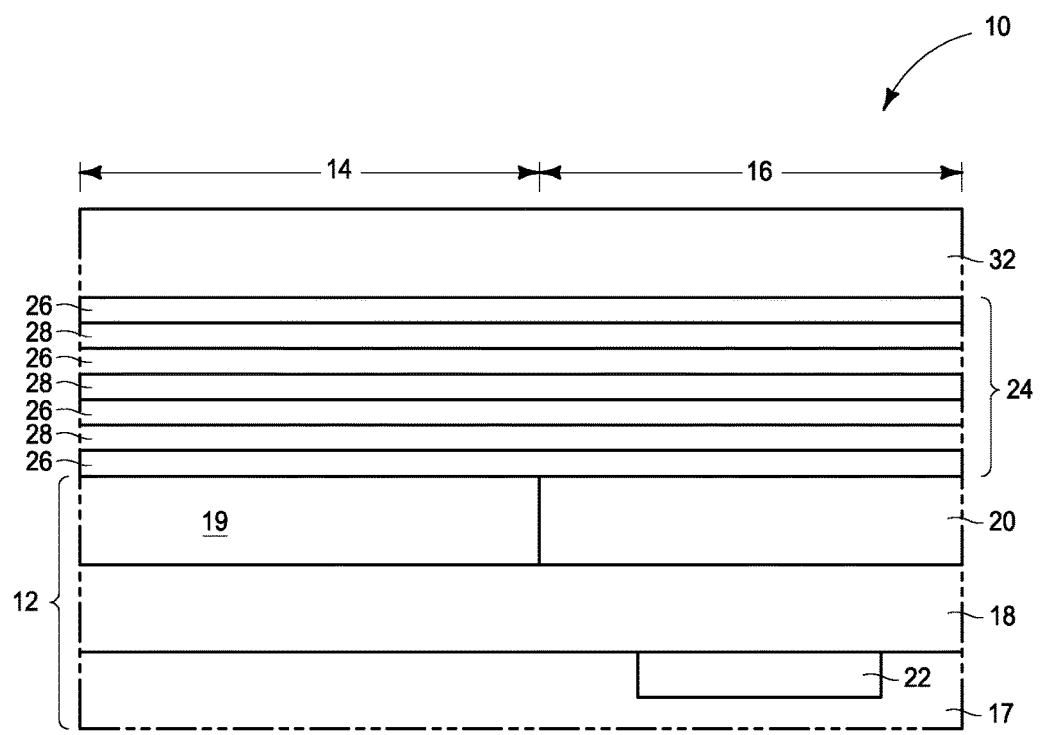
FIG. 1 is a diagrammatic sectional view of a substrate fragment in process in accordance with an embodiment of the invention.

Referring to FIG. 1, a substrate fragment 10 may be considered as comprising a base substrate 12 that may include any one or more of conductive/conductor/conducting (i.e., electrically herein), semiconductive, or insulative/insulator/insulating (i.e., electrically herein) materials. Various materials are shown as constituting part of base substrate 12 and various materials are shown above base substrate 12. Materials may be aside, elevationally inward, or elevationally outward of the FIG. 1—depicted materials. For example, other partially or wholly fabricated components of integrated circuitry may be provided somewhere above, about, or within substrate 10. Control and/or other peripheral circuitry for operating components within the memory array may also be fabricated, and may or may not be wholly or partially within a memory array or sub-array. Further, multiple sub-arrays may also be fabricated and operated independently, in tandem, or otherwise relative one another. As used in this document, a "sub-array" may also be considered as an array. Regardless, any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Substrate 10 may be considered as comprising a first region 14 and a second region 16 which is laterally of first region 14 (in one embodiment, immediately laterally adjacent and contacting first region 14). A vertical string of memory cells will be formed in first region 14 and a conductive via will be formed in second region 16. First and second regions 14 and 16 may both be part of or within a memory array. Alternately, as an example, first region 14 may be part of a memory array and second region 16 may be positioned laterally of a memory array.

Example substrate 12 comprises semiconductor material 17, for example monocrystalline silicon, having a conductively doped source material 19 formed there-over or therein within first region 14 and which may comprise a portion of circuitry for the vertical string of memory cells being fabricated. An insulator 20 (e.g., doped or undoped silicon dioxide and/or silicon nitride) is shown in second region 16, and an insulator 18 (e.g., doped or undoped silicon dioxide and/or silicon nitride) is shown in first and second regions 14 and 16 elevationally between semiconductor material 17 and materials 19, 20. An example source material 19 is conductively doped poly silicon of about 500 Angstroms thickness over an underlying layer of tungsten silicide of about 900 Angstroms thickness. In this document, "thickness" by itself (no preceding directional adjective) is defined as the mean straight-line distance through a given material or region perpendicularly from a closest surface of an immediately adjacent material of different composition or of an immediately adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another. Insulator 20 may be of the same thickness as source material 19, as shown. An example thickness for insulator 18 is from about 2,000 to 5,000 Angstroms.

Semiconductor material 17 is shown as having a conductive region 22 therein within second region 16 and to which a conductive via to be formed in one embodiment will be directly electrically coupled. In this document, devices/materials/components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the devices/materials/components. In contrast, when devices/materials/components are referred to as being "directly electrically coupled", no intervening electronic component is between the directly electrically coupled devices/materials/components. Example materials for conductive region 22 include one or more of conductively doped semiconductive material, an elemental metal, a mixture of two or more elemental metals, an alloy of two or more elemental metals, and conductive metal compounds.

A lower material 24 has been formed over substrate 12. Reference to "lower" material is relative to an "upper" material to be formed subsequently and as described below by way of example. In one embodiment and as shown, lower material 24 comprises vertically-alternating tiers of different composition insulating materials 26 and 28. Example such materials are silicon dioxide and silicon nitride regardless of order in the depicted stack of materials. Example thicknesses for each are from about 200 Angstroms to about 400 Angstroms, and such need not be of the same respective thicknesses nor of the same thickness relative one another when materials 26 and 28 individually are of constant thickness. Lower material 24 is shown as having seven vertically-alternating tiers, although fewer or likely many more (e.g., dozens, hundreds, etc.) may be formed. A hard mask material 32 (e.g., carbon deposited to a thickness of 15,000 Angstroms) has been formed over lower material 24. Top layer 26 of lower material 24 may be made thicker than shown or an alternate material provided there-over (not shown) where desired as an etch stop or a polish stop for better assuring a planar horizontal substrate (if desired) before forming an upper material there-over.

Figure 2:
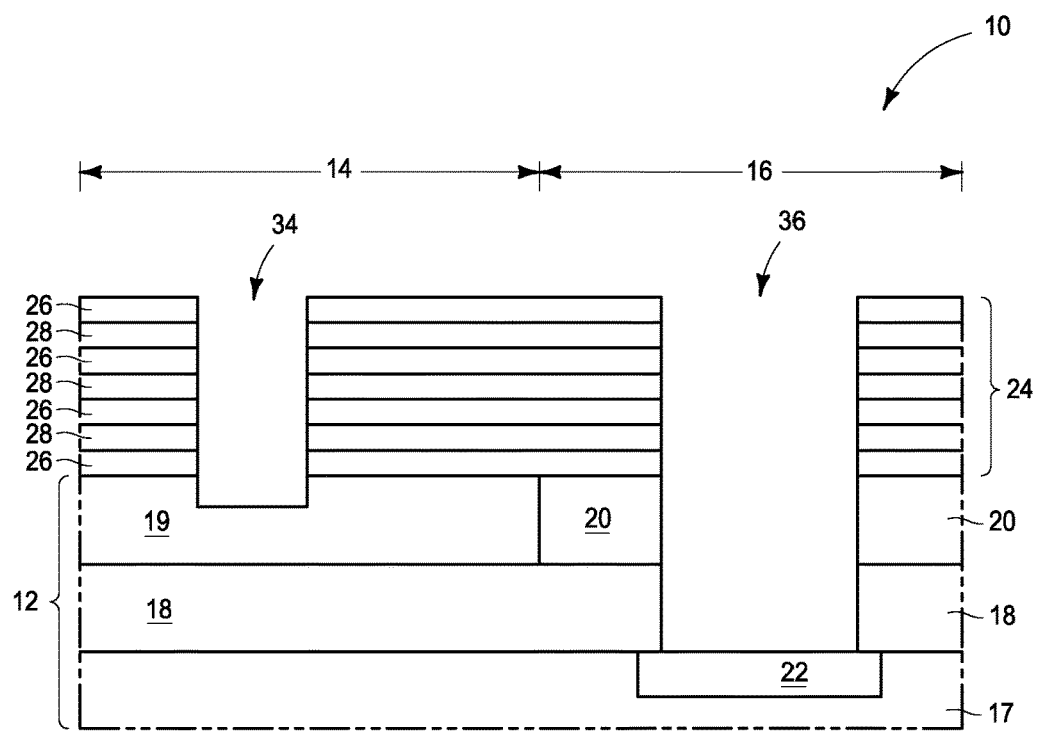
FIG. 2 is a view of the FIG. 1 substrate at a processing step subsequent to that shown by FIG. 1.

Referring to FIG. 2, a first lower opening 34 and a second lower opening 36 have been formed into lower material 24. In one embodiment and as shown, first lower opening 34 has been formed through lower material 24 into source material 19 and second lower opening 36 has been formed through lower material 24, through insulator 20, and through insulator 18 to conductive region 22. An example technique for doing so includes lithographic or other patterning of hard mask material 32 (not shown) followed by dry anisotropic etching using hard mask material 32 as an etch mask. Pitch multiplication may be used. Hard mask material 32 (not shown) may be removed during and/or after forming openings 34 and 36. First and second lower openings 34 and 36 are shown as comprising straight and vertical sidewalls in the depicted vertical cross-section, although such need not and may not be so. Further and regardless, first and second lower openings 34 and 36 individually may be circular ellipsoidal, rectangular, or of other shape in horizontal cross-section. As but one example, first lower opening 34 may be substantially circular having a maximum horizontal open dimension of from about 850 to 1,250 Angstroms at its elevationally-outermost portion and which tapers (not shown) to a horizontal open dimension of about 5% to 10% less at its elevationally-innermost portion where meeting with source material 19. Only one first lower opening 34 is shown in FIG. 2 for clarity and simplicity, although hundreds, thousands, etc. of such openings would likely be formed for ultimate formation of hundreds, thousands, etc. of vertical strings of memory cells.

Regarding second lower opening 36, and in but one example, such is substantially circular having a maximum horizontal open dimension at its elevationally-outermost portion which is greater than that of first lower opening 34, for example from about 2,000 Angstroms to 4,000 Angstroms and which may also taper (not shown) to a horizontal open dimension which is less at its elevationally-innermost portion where meeting with conductive region 22. Making second lower opening 36 to have a wider maximum horizontal open dimension than that of first lower opening 34 facilitates etching of second lower opening 36 deeper into the respective materials (where desired) when dry anisotropically etching openings 34 and 36 at the same time. An example dry anisotropic etching chemistry for etching the depicted first and second lower openings 34, 36 using a single chemistry where materials 18, 20, 26, and 28 are a combination of silicon dioxide and silicon nitride is a mixture of $C_4F_6$, $C_4F_8$, $CH_2F_2$, $O_2$, and $NF_3$. Again, only a single second lower opening 36 is shown for clarity and simplicity. Many more such openings to conductive regions would almost certainly be formed, and perhaps not through all of the shown materials.

Figure 3:
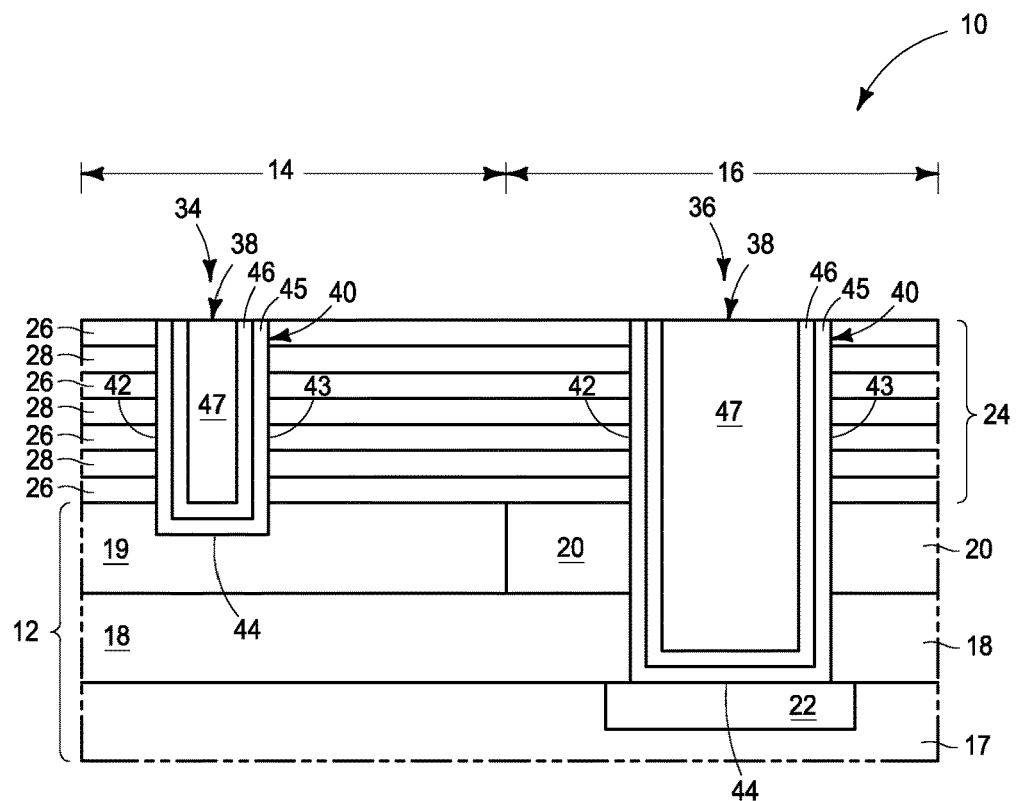
FIG. 3 is a view of the FIG. 2 substrate at a processing step subsequent to that shown by FIG. 2.
Figure 4:
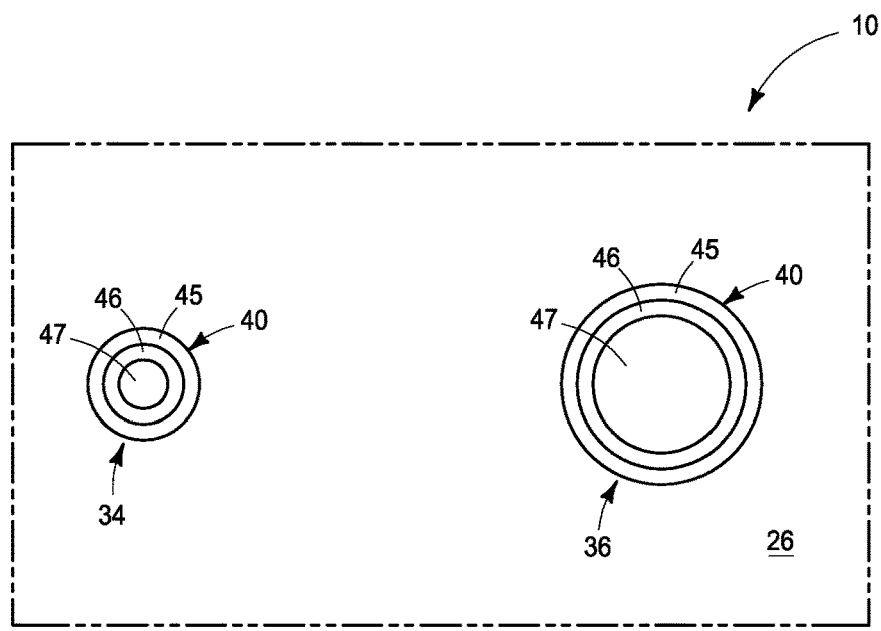
FIG. 4 is a diagrammatic top view of FIG. 3.

Referring to FIGS. 3 and 4, first material 38 has been formed within first and second openings 34, 36, and in one embodiment is formed to be conductive. First material 38 will be entirely or partially sacrificial as formed in first lower opening 34. First material 38 as formed in second lower opening 36 may be partially, entirely, or not at all sacrificial. In one embodiment where conductive, the first material comprises a combination of a) at least one of an elemental metal, a mixture of elemental metals, or an alloy of elemental metals, and b) a conductive metal compound, with the material of (a) and the material of (b) being directly against one another. In one embodiment and as shown, forming the first material comprises forming a conductive container 40 having opposing sidewalls 42, 43 and a base 44 extending between sidewalls 42, 43 in vertical cross-section (e.g., the vertical cross-section shown in FIG. 3) in each of first lower opening 34 and second lower opening 36. Conductive fill material 47 has been formed within each conductive container 40 in each of first lower opening 34 and second lower opening 36, with conductive fill material 47 in one embodiment being of different composition from that of opposing sidewalls 42, 43 and base 44 of each conductive container 40 in each of the first and second lower openings 34, 36.

Opposing sidewalls 42, 43 and base 44 of each of the respective individual conductive containers 40 shown in openings 34 and 36 may be homogenous (not shown) or non-homogenous (e.g., as shown). For example, container sidewalls 42, 43 and base 44 may comprise two different composition materials 45 and 46, with an example material 45 being elemental titanium and an example material 46 being TiN. An example fill material 47 is elemental tungsten. An example technique for forming the depicted first material 38 is to deposit materials 45, 46, and 47 blanketly over the substrate, with fill material 47 overfilling remaining volume of the first and second lower openings after deposition of materials 45 and 46. Materials 47, 46 and 45 may then be planarized back, for example by chemical-mechanical polishing, to stop on the elevationally-outermost material 26 (as shown) or some material formed there-over (not shown).

Figure 5:
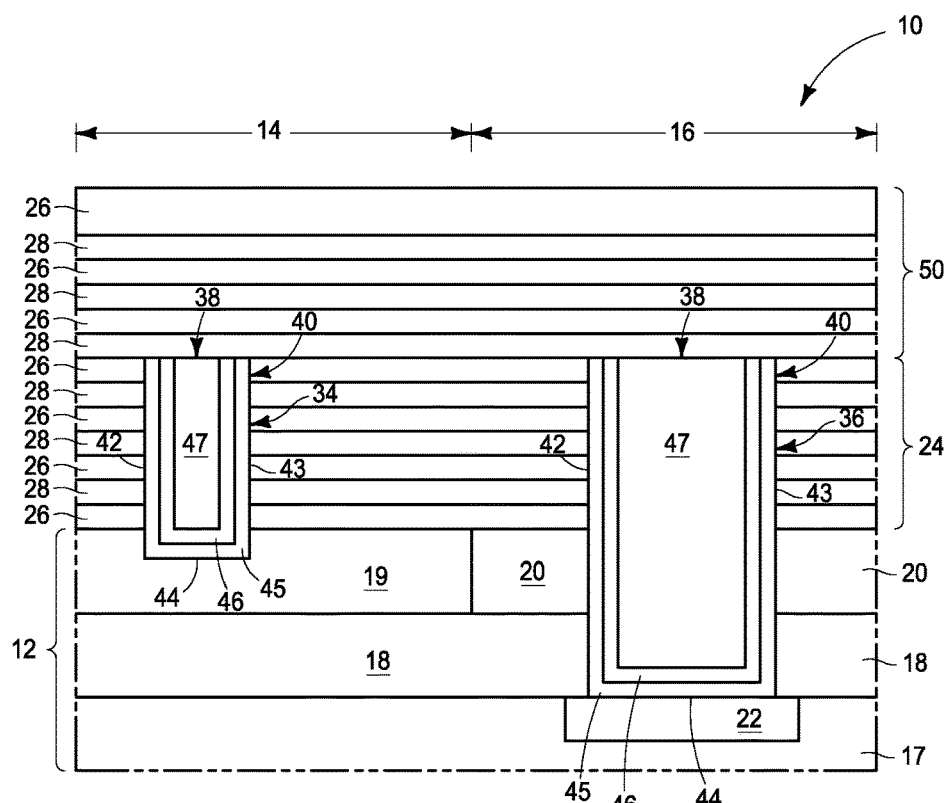
FIG. 5 is a view of the FIG. 3 substrate at a processing step subsequent to that shown by FIG. 3.

Referring to FIG. 5, an upper material 50 has been formed above lower material 24 and above first material 38 in first and second lower openings 34, 36. In one embodiment and as shown, upper material 50 comprises vertically-alternating tiers of different composition insulating materials, and in one embodiment may be the same as lower material 24 when it comprises vertically-alternating tiers of different composition insulating materials. FIG. 5 shows vertically-alternating tiers of materials 26, 28 for upper material 50 being the same as lower material 24. Where vertically-alternating tiers of different composition insulating materials are used for materials 24 and 50, the same, fewer, or more tiers may be used, and with the same or different respective thicknesses. Upper material 50 is shown as having six tiers, although fewer or likely many more (e.g., dozens, hundreds, etc.) may be formed. The discussion proceeds with reference to forming a single lower material 24 for a single lower deck and a single upper material 50 for a single upper deck. However, additional material(s) for additional decks may be used.

Figure 6:
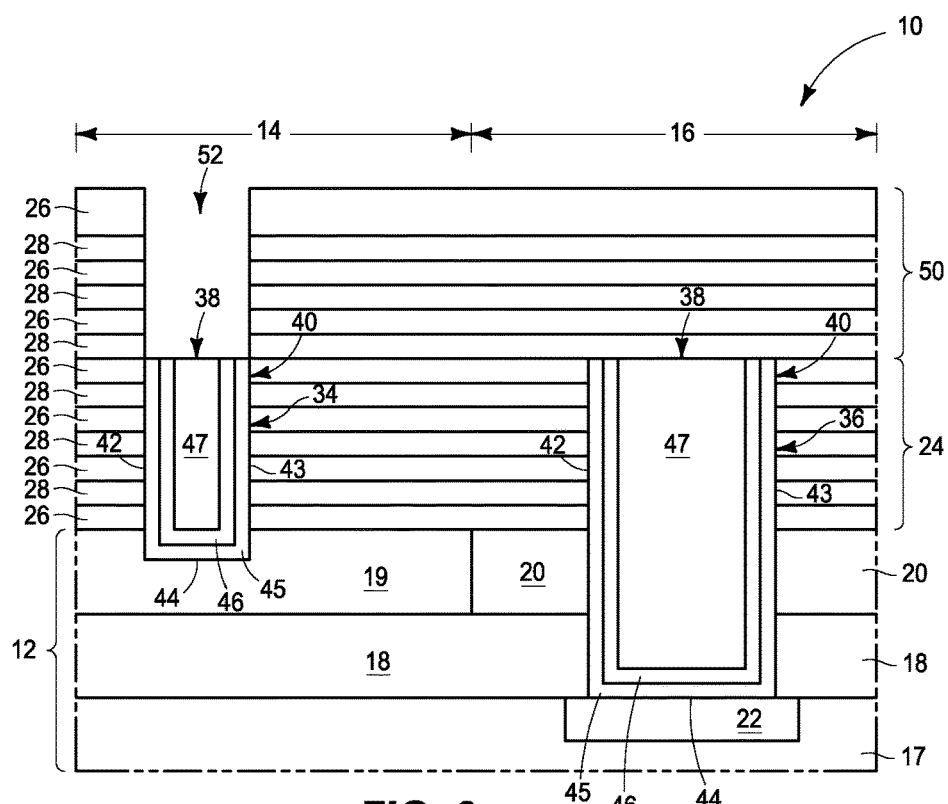
FIG. 6 is a view of the FIG. 5 substrate at a processing step subsequent to that shown by FIG. 5.

Referring to FIG. 6, a first upper opening 52 has been formed through upper material 50 to first material 38 in first lower opening 34. Example techniques for doing so include those described above for formation of first lower opening 34. First upper opening 52 may be formed to have the same horizontal size and shape as that of first opening 34, and in one ideal embodiment is formed centrally/perfectly aligned there-over or nearly so. Sidewalls of first upper opening 52 are shown as being straight and vertical although need not be so. For example, such may taper inwardly (not shown) as described above with respect to openings 34 and 36.

Figure 7:
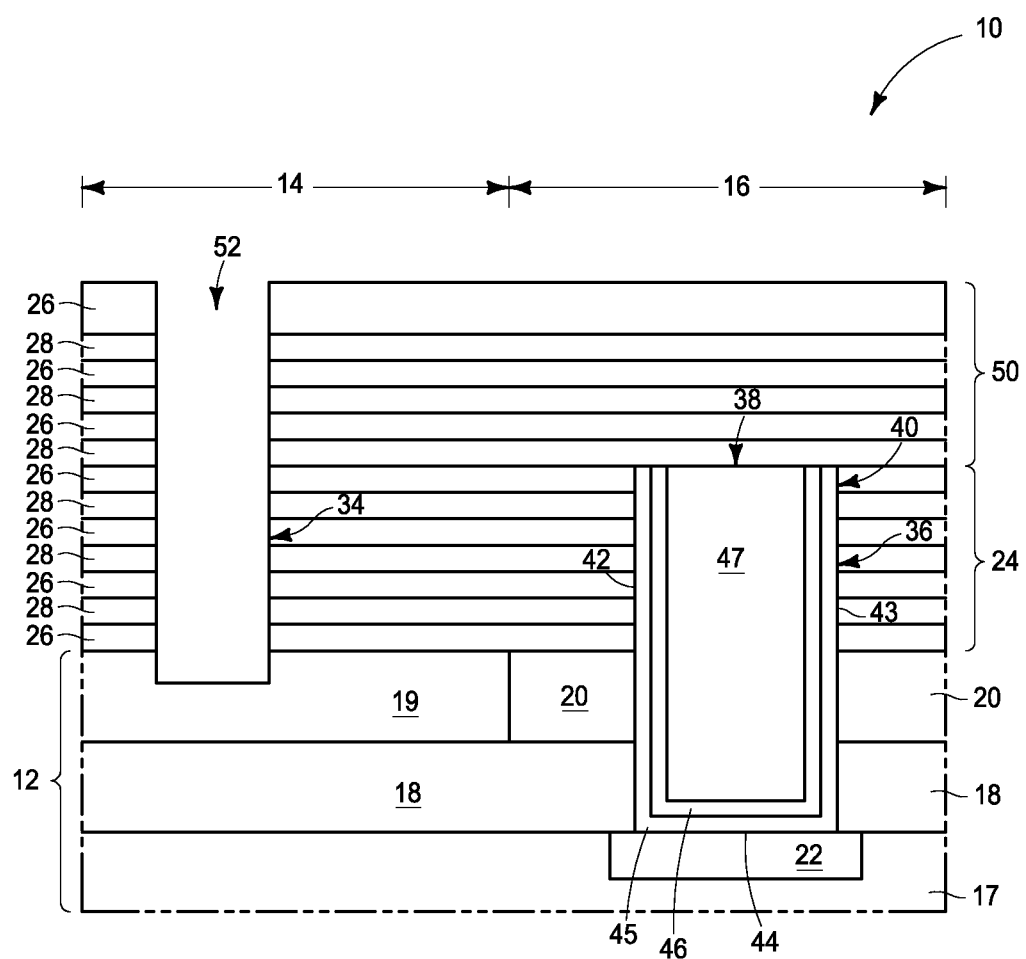
FIG. 7 is a view of the FIG. 6 substrate at a processing step subsequent to that shown by FIG. 6.

Referring to FIG. 7, at least a majority of first material 38 (not shown) that was within first lower opening 34 has been removed through first upper opening 52. In one embodiment, all first material 38 is removed from first lower opening 34 (as shown), and in one embodiment less than all (not shown) of first material 38 is removed from first lower opening 34. By way of example only, where first material 38 is conductive, a timed etch may be conducted whereby a small portion of first material 38 remains (not shown) in a lowest portion of first lower opening 34 and that is electrically coupled to source material 19 in a finished circuitry construction. Regardless, example removing techniques for first material 38 include wet and/or dry isotropic etching of first material 38 selectively relative to tier materials 26 and 28. An example wet etching chemistry is a mixture of $NH_4OH$ and $H_2O_2$. In this document, a selective etch or removal is an etch or removal where one material is removed relative to another stated material at a rate of at least 2.0:1. In one embodiment and as shown, no first material 38 is removed from second lower opening 36 during the removing of first material 38 from first lower opening 34, and in one embodiment and as shown wherein the top of first material 38 that is within second lower opening 36 is completely covered by upper material 50 during the removing of the first material 38 from first lower opening 34.

Figure 8:
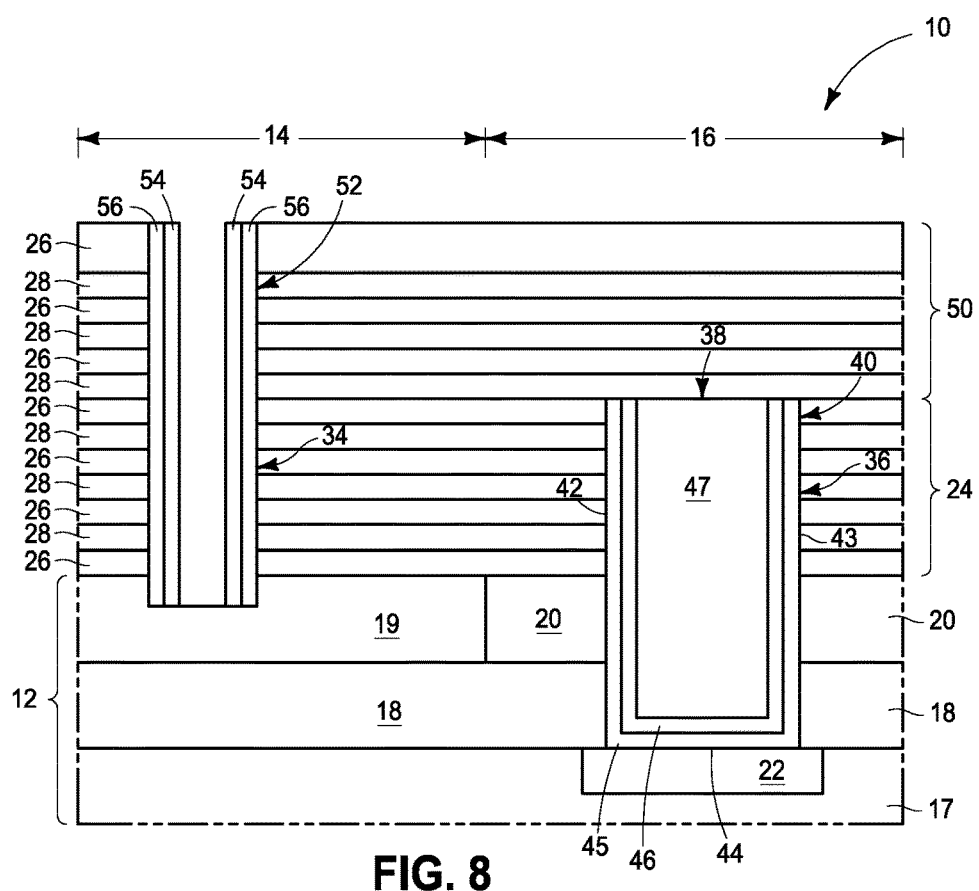
FIG. 8 is a view of the FIG. 7 substrate at a processing step subsequent to that shown by FIG. 7.
Figure 9:
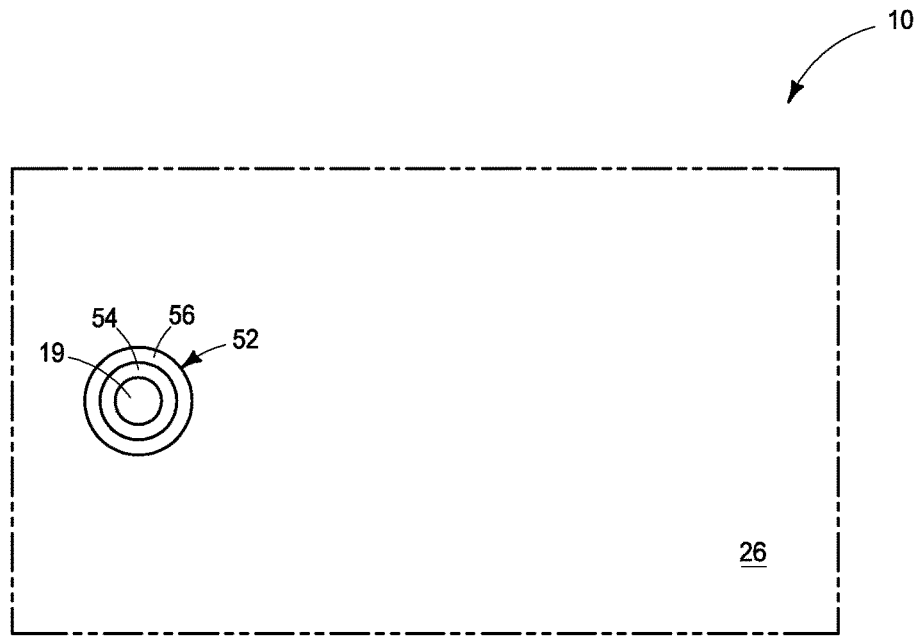
FIG. 9 is a diagrammatic top view of FIG. 8.
Figure 10:
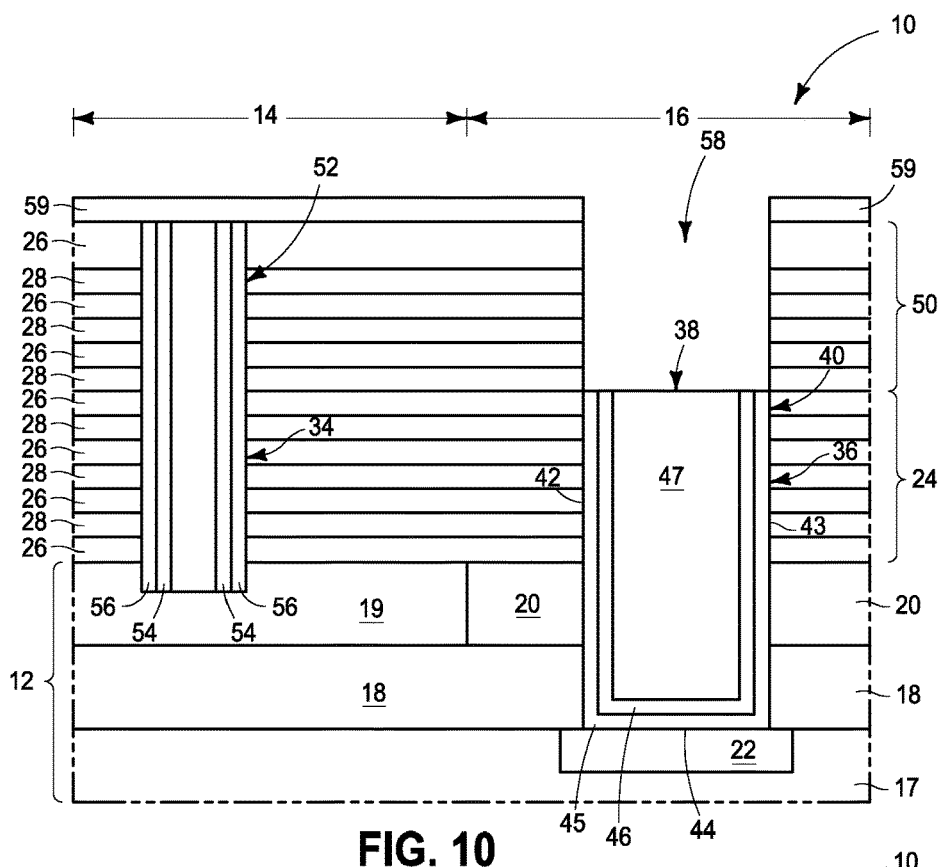
FIG. 10 is a view of the FIG. 8 substrate at a processing step subsequent to that shown by FIG. 8.

Referring to FIGS. 8 and 9, channel material 54 has been formed within first lower opening 34 and first upper opening 52 for the vertical string of memory cells being formed. In one embodiment and as shown, channel material 54 is formed as a hollow channel and ultimately may have dielectric material (not shown in FIGS. 8 and 9) formed radially-inward thereof. Alternately, non-hollow channels may be used. Channel material 54 ideally comprises semiconductive material (e.g., poly silicon) suitably doped with conductivity enhancing impurity, with an example conductivity impurity doping range being from $5\times10^{17}$ atoms/cm$^3$ to $5\times10^{18}$ atoms/cm$^3$. FIGS. 8 and 9 show formation of a material 56 within first lower opening 34 and first upper opening 52 prior to forming channel material 54 therein. Such may comprise, for example, a tunnel insulator comprising a composite of multiple different composition and thickness dielectric materials ultimately directly against channel material 54, charge storage material (e.g., Si$_3$N$_4$) radially outward of the tunnel insulator composite, and control gate blocking insulator (e.g., Al$_2$O$_3$ and/or a silicon dioxide/silicon nitride/silicon dioxide composite) radially outward of the charge storage material, for example in a "gate-last" processing technique and architecture.

After forming the channel material, a second upper opening is formed through the upper material to the first material that is in the second lower opening. Such is shown by way of example in FIG. 10. Such shows a masking material 59 (e.g., silicon nitride) formed over upper material 50 and channel material 54 (and material 56) within first upper and lower openings 52 and 34. A second upper opening 58 has then been formed through masking material 59 and upper material 50 to first material 38 that is in second lower opening 36. Example techniques for doing so include those described above for formation of second lower opening 36. Second upper opening 58 may be formed to have the same horizontal size and shape as that of second lower opening 36, and in one ideal embodiment is formed centrally/perfectly aligned there-over or nearly so. Sidewalls of second upper opening 58 are shown as being straight and vertical although need not be so. For example, such may taper inwardly (not shown) as described above with respect to openings 34 and 36. In one embodiment, the top of channel material 54 that is within first upper opening 52 is completely covered (e.g., by masking material 59) during the forming of second upper opening 58 through upper material 50 to first material 38 in second lower opening 36. In one such embodiment, the top of channel material 54 is completely covered by a sacrificial material (e.g., by masking material 59) of different composition from that of channel material 50 and that is removed from over said top of the channel material (e.g., by polish or etch-back) after forming second upper opening 58, for example as described below.

Figure 11:
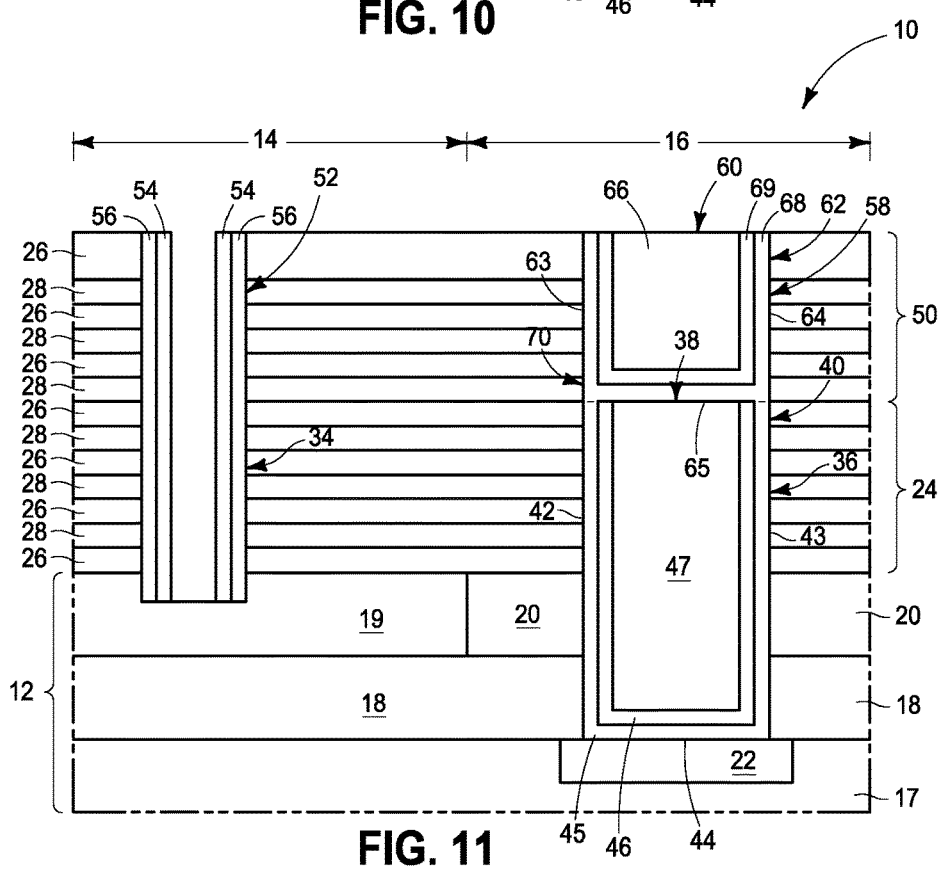
FIG. 11 is a view of the FIG. 10 substrate at a processing step subsequent to that shown by FIG. 10.

Conductive material of the conductive via being formed is ultimately formed within the second upper opening. Such conductive material may be homogenous or non-homogenous. One example technique in the formation of non-homogenous conductive material of the conductive via within the second upper opening is described with reference to FIG. 11. Such shows a non-homogenous conductive material 60 formed within second upper opening 58 in the formation of another conductive container 62 having opposing sidewalls 63, 64 and a base 65 extending between sidewalls 63, 64 in the depicted vertical cross-section in second upper opening 58. Conductive fill material 66 has been formed within conductive container 62, with such in one embodiment being of different composition from that of opposing sidewalls 63, 64 and base 65 of conductive container 62. Opposing sidewalls 63, 64 and base 65 of conductive container 62 may be homogenous (not shown) or non-homogenous (e.g., as shown). Opposing sidewalls 63, 64 are shown as comprising two different composition conductive materials 68 and 69 (e.g., elemental titanium and TiN, respectively) that are directly against one another. Container 62, by way of example, may be formed in the same manner as described above in the formation of containers 40, and masking material 59 (not shown) may be removed in the process. Regardless, FIG. 11 shows formation of a conductive via 70 extending through upper material 50 and lower material 24 and which in one embodiment is directly electrically coupled to material of region 22. Conductive materials 68 and 45 may be of the same composition and as is exemplified and shown by a dashed-line interface between contacting materials 68 and 45. Conductive materials 69 and 46 may be of the same composition and conductive materials 66 and 47 may be of the same composition. Alternately, any two such conductive material pairs 68,45; 69,46; and/or 68,45 may be of different respective compositions relative one another. Regardless, in one embodiment, the conductive material formed in the second upper opening is directly electrically coupled to the first material in the second lower opening.

Figure 12:
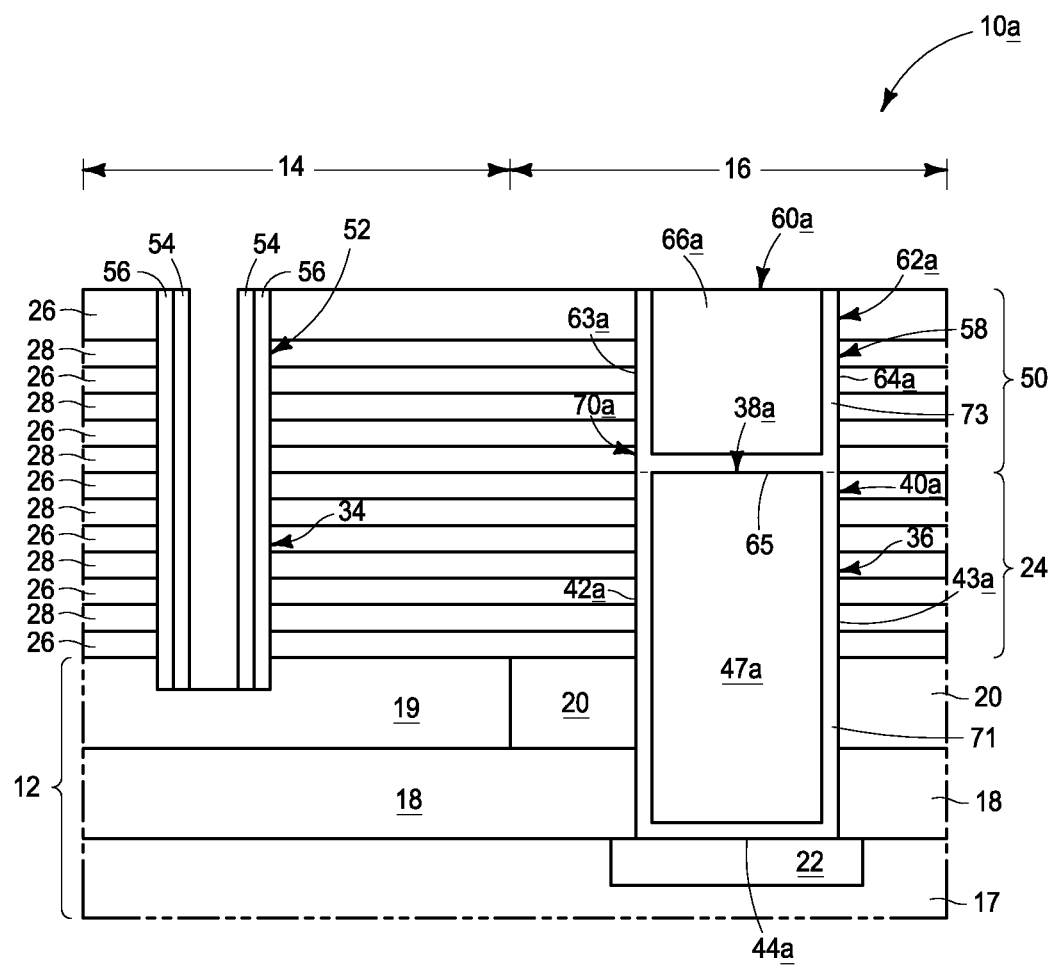
FIG. 12 is a diagrammatic sectional view of a substrate fragment in process in accordance with an embodiment of the invention.

Methods in accordance with this disclosure may produce alternate construction conductive vias, for example a conductive via 70a as shown with respect to a substrate construction 10a in FIG. 12. Like numerals from the above-described embodiments have been used where appropriate, with some construction differences being indicated with the suffix "a" or with different numerals. For example, conductive opposing sidewalls 42a, 43a and base 44a of conductive container 40a may be formed of a single homogenous material 71 (i.e., any suitable conductive material). Further in one embodiment and as shown, opposing conductive sidewalls 63a, 64a and base 65a of conductive container 62a may also be formed of a single homogenous composition 73, which as shown in the depicted example is the same as composition 71 in container 40a as is exemplified by a dashed-line interface between contacting materials 71 and 73.

Figure 13:
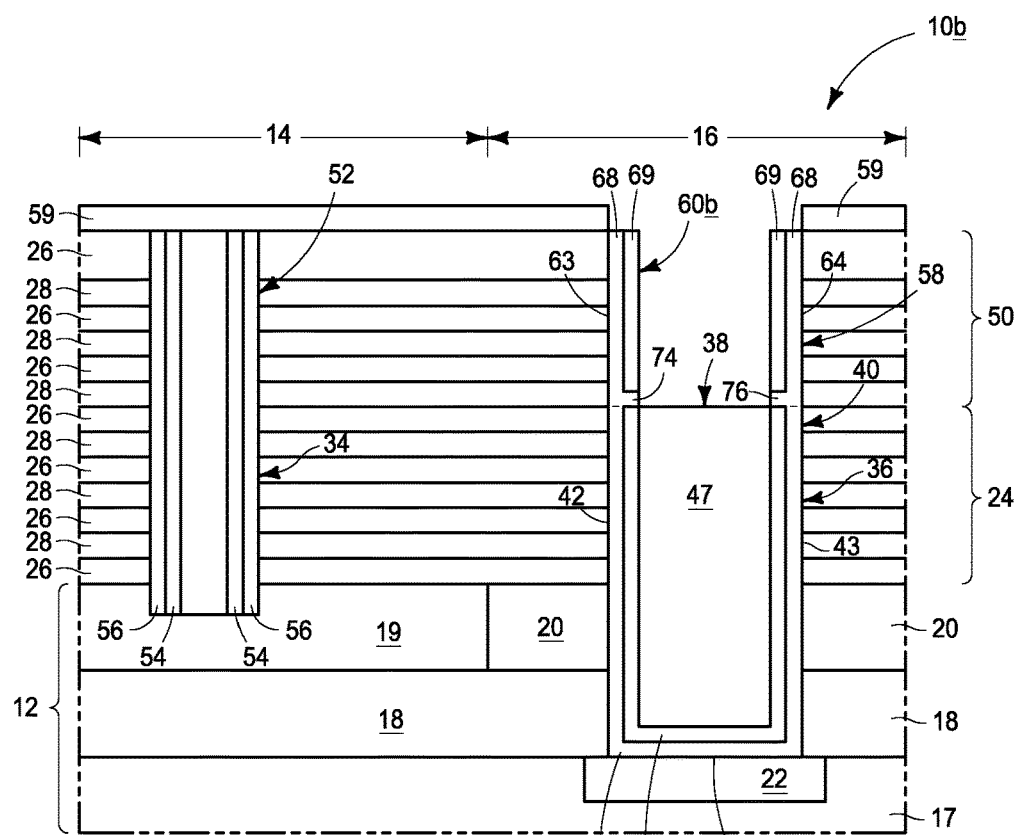
FIG. 13 is a diagrammatic sectional view of a substrate fragment in process in accordance with an embodiment of the invention.
Figure 14:
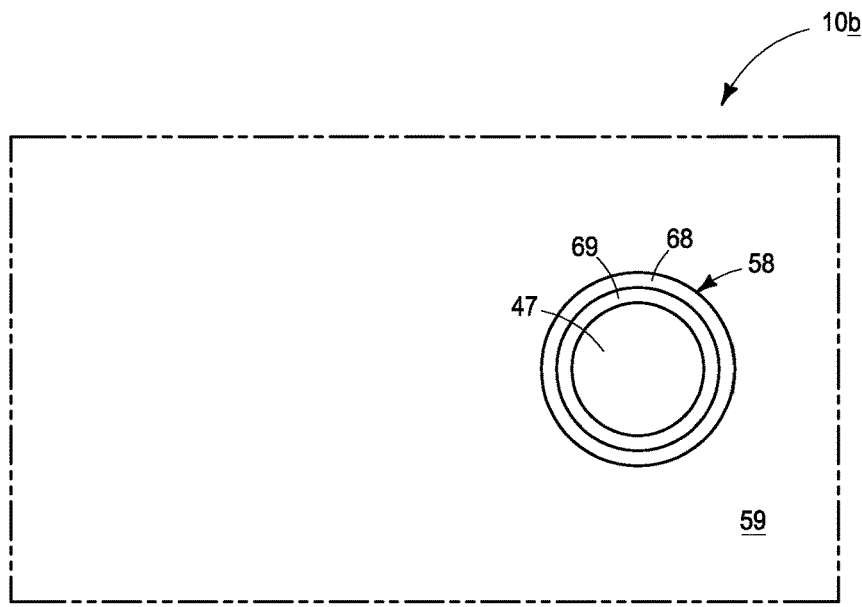
FIG. 14 is a diagrammatic top view of FIG. 13.
Figure 15:
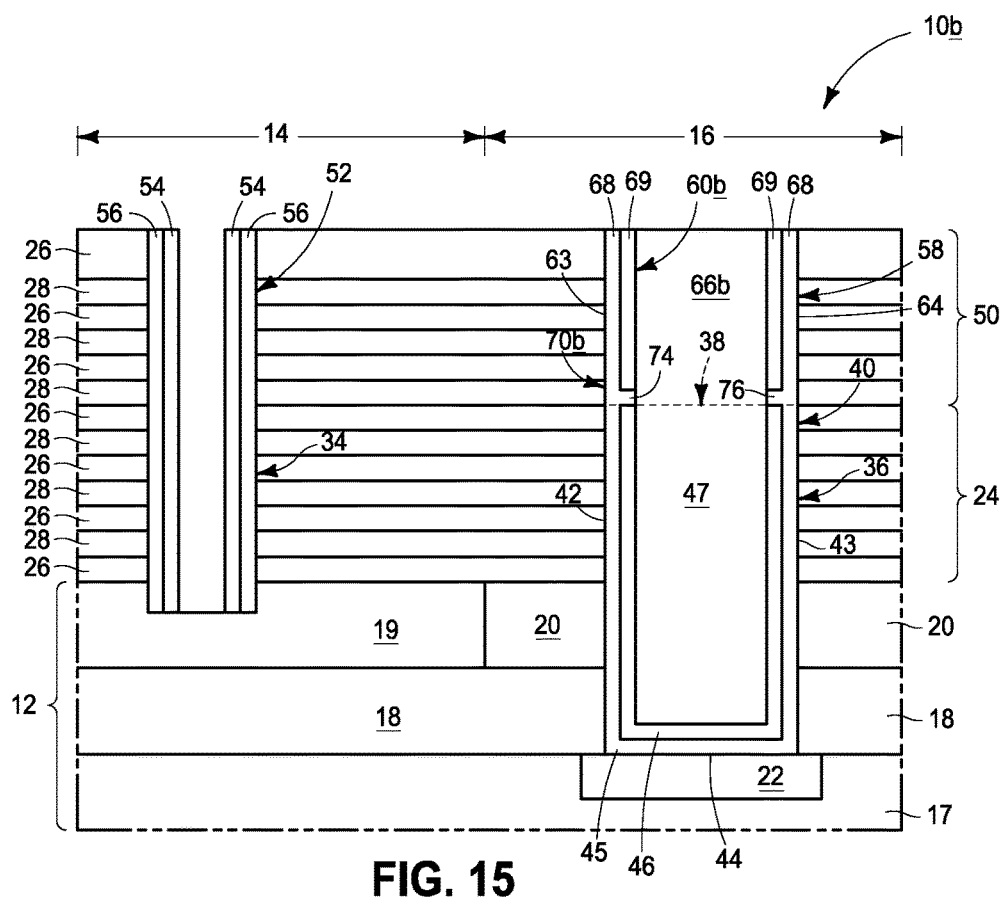
FIG. 15 is a view of the FIG. 13 substrate at a processing step subsequent to that shown by FIG. 13.
Figure 16:
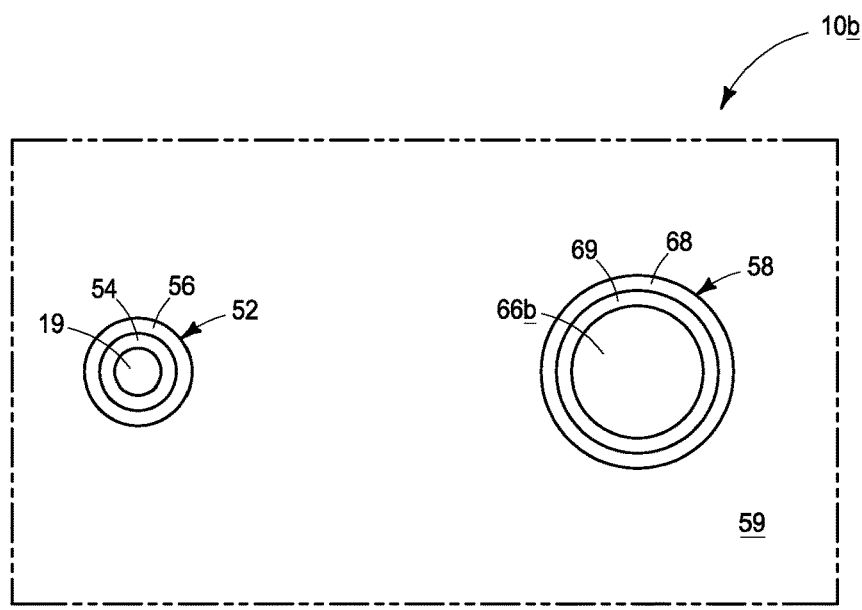
FIG. 16 is a diagrammatic top view of FIG. 15.

Another example alternate embodiment is shown and described with respect to a substrate fragment 10b in FIGS. 13-16. Like numerals from the above-described embodiments have been used where appropriate, with some construction differences being indicated with the suffix "b" or with different numerals. Referring to FIGS. 13 and 14, materials 68 and 69 have been formed within second upper opening 58. One or both of materials 68 and 69 in this embodiment may be insulative or semiconductive (i.e., neither needs to be conductive). Then, and prior to deposition of fill material 66 as shown in FIG. 11, etching is conducted through base 65 (not shown in FIGS. 13 and 14) of what was the former container 62 (not shown as materials 68, 69 no longer form a container in FIGS. 13 and 14 due to the bottoms/bases thereof being removed) in second upper opening 58 to expose first material 38 in second lower opening 36. Referring to FIGS. 15 and 16, conductor material 66b has been formed in second upper opening 58 and in one embodiment directly against materials 68 and 69 of former container 62 (not shown) in second upper opening 58. Conductor material 66b may be deposited to overfill remaining volume of second upper opening 58 and then planarized back at least to the elevationally outermost surface of upper material 50, and for example whereby a via 70b is formed.

In one such embodiment and as shown, first material 38 in second lower opening 36 comprises a conductive container 40 having opposing sidewalls 42, 43 and a base 44 extending there-between in the vertical cross-section in second lower opening 36, and with first material 38 comprising conductive fill material 47 within conductive container 40 in second lower opening 36. In one embodiment, conductor material 66b is of the same composition as fill material 47 (e.g., elemental tungsten) and is formed directly against fill material 47 (e.g., as shown by a dashed-line interface between contacting materials 47 and 66b). In one embodiment, conductive container 40 of first material 38 within second lower opening 36 comprises two different composition conductive materials (e.g., 46, 45) with each having its own opposing sidewalls and a base extending between its sidewalls in the vertical cross-section.

One or both of materials 68 or 69 may not be conductive in the 10*b* embodiment. In one such embodiment where material 68 is conductive, the etching to expose first material 38 in second lower opening 36 forms laterally opposing conductive projections 74, 76 that project radially inward toward one another elevationally over the tops of a radially-inner (e.g., 46) of the two different composition materials 45, 46. Where material 68 is not conductive (i.e., is semiconductive and/or insulative), opposing projections 74, 76 are not conductive.

Embodiments of the invention encompass removing some, all, or none of first material 38 from within second lower opening 36. For example and by way of example only, the etching depicted in FIG. 10 to form second upper opening 58 to first material 38 may remove some (not shown) or none (shown) of first material 38. As an additional example with respect to the embodiments shown by FIGS. 13-16, the etching depicted by FIGS. 13 and 14 may remove some (not shown) or none (shown) of material 47. As an additional example, although not preferred, all of first material 38 might be removed from second lower opening 36 subsequent to the processing shown by FIG. 10, for example particularly where first material 38 is not conductive.

Figure 17:
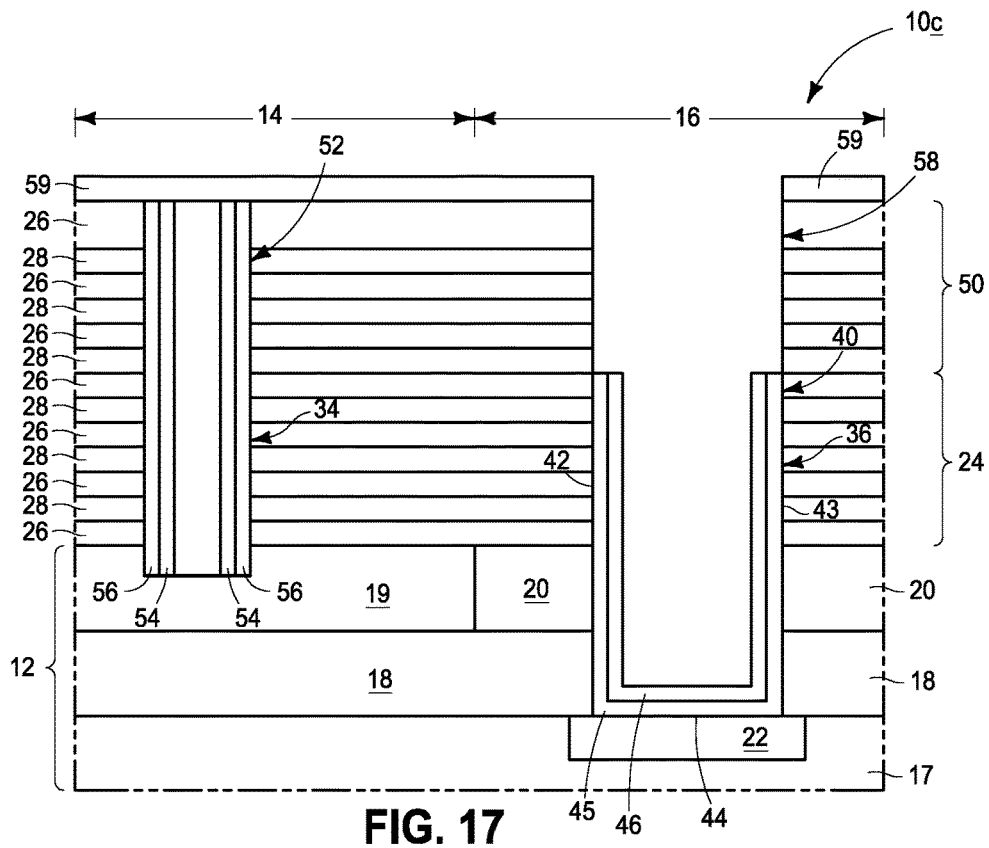
FIG. 17 is a diagrammatic sectional view of a substrate fragment in process in accordance with an embodiment of the invention.
Figure 18:
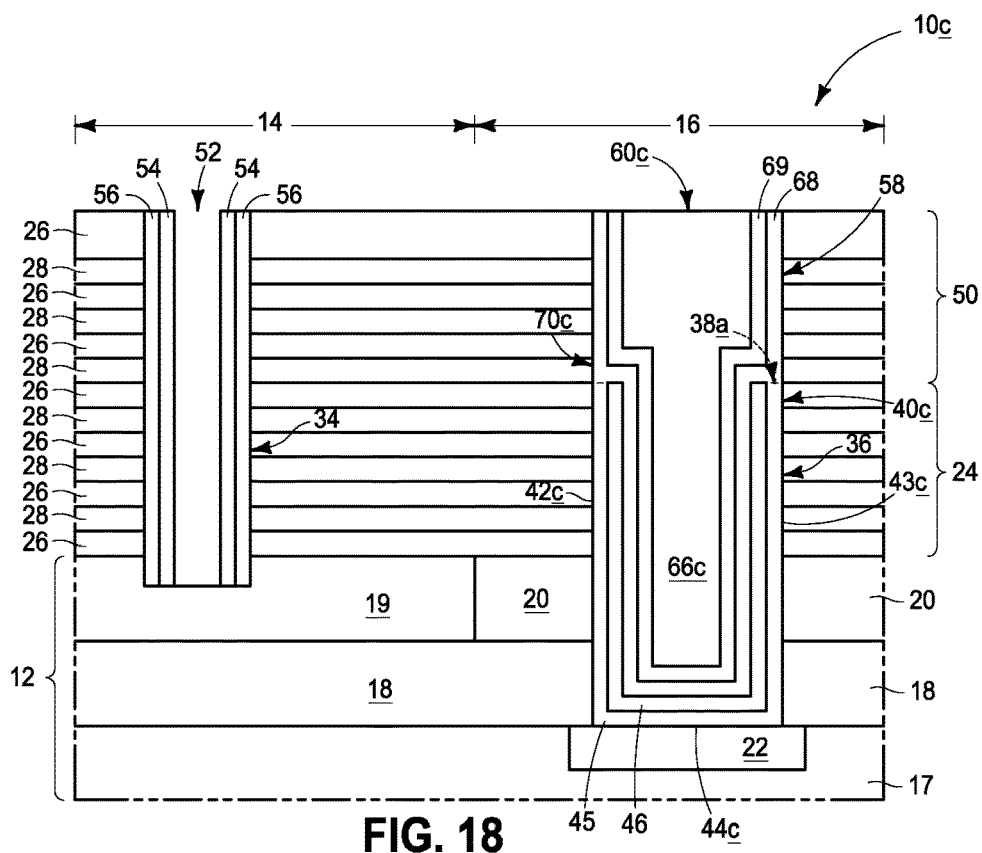
FIG. 18 is a view of the FIG. 17 substrate at a processing step subsequent to that shown by FIG. 17.

Another example alternate embodiment is shown and described with respect to a substrate fragment 10*c* in FIGS. 17 and 18. Like numerals from the above-described embodiments have been used where appropriate, with some construction differences being indicated with the suffix "c" or with different numerals. FIG. 17 shows processing conducted immediately subsequent to FIG. 10 wherein at least half (i.e., by volume) of first material 38 has been removed from second lower opening 36 through second upper opening 58, and in one embodiment may be removed by a wet or dry isotropic etch of fill material 47 (not shown) conducted selectively relative to materials 26, 28, 45, and 46.

Referring to FIG. 18, conductive material 60*c* of a conductive via 70*c* has been formed within second upper opening 58, and which also forms conductor material 60*c* within second lower opening 36. Conductor material 60*c* is shown as comprising materials 68*c*, 69*c*, and 66*c* (each being conductive in this embodiment), although fewer (not shown) or a single homogenous conductor material (not shown) may be used. The processing of FIG. 18 also shows an example embodiment that comprises removing less than all of first material 38 from second lower opening 36 through second upper opening 58 before the forming of conductor material 60*c* of a conductive via 70*c* within second upper opening 58.

Figure 19:
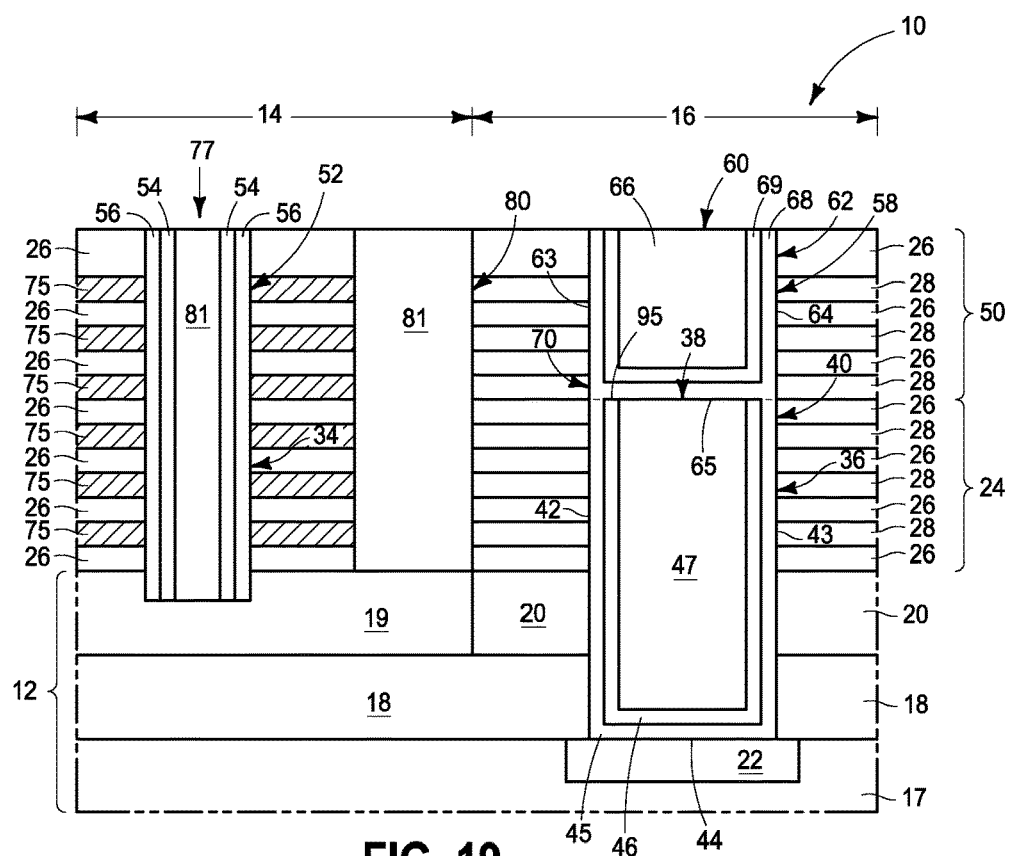
FIG. 19 is a view of the FIG. 11 substrate at a processing step subsequent to that shown by FIG. 11.

FIG. 19 shows subsequent processing having been conducted relative to the FIG. 11 substrate in forming a vertical string 77 of memory cells in conjunction with an example "gate-last" process. Control gate/wordline patterning has been conducted by forming openings 80 (only one being shown for simplicity) through alternating tier materials 26, 28. Such has been followed by an isotropic etch of material 28 selectively relative to material 26, followed by depositing conductive control gate material 75 in place thereof. Dielectric material 81 is shown as ultimately being formed within opening 80 and centrally within hollow channel material 54. Such forms at least one individual memory cell comprising materials 75, 56, and 54 with respect to each tier within which material 75 is shown.

Figure 20:
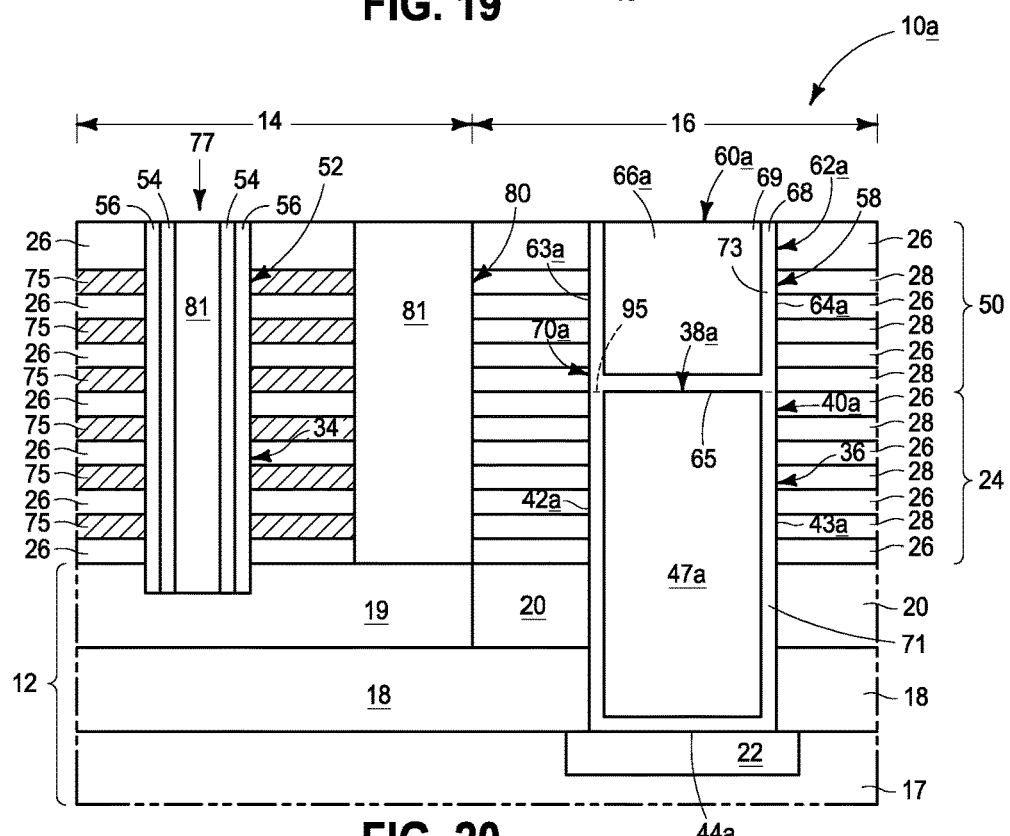
FIG. 20 is a view of the FIG. 12 substrate at a processing step subsequent to that shown by FIG. 12.
Figure 21:
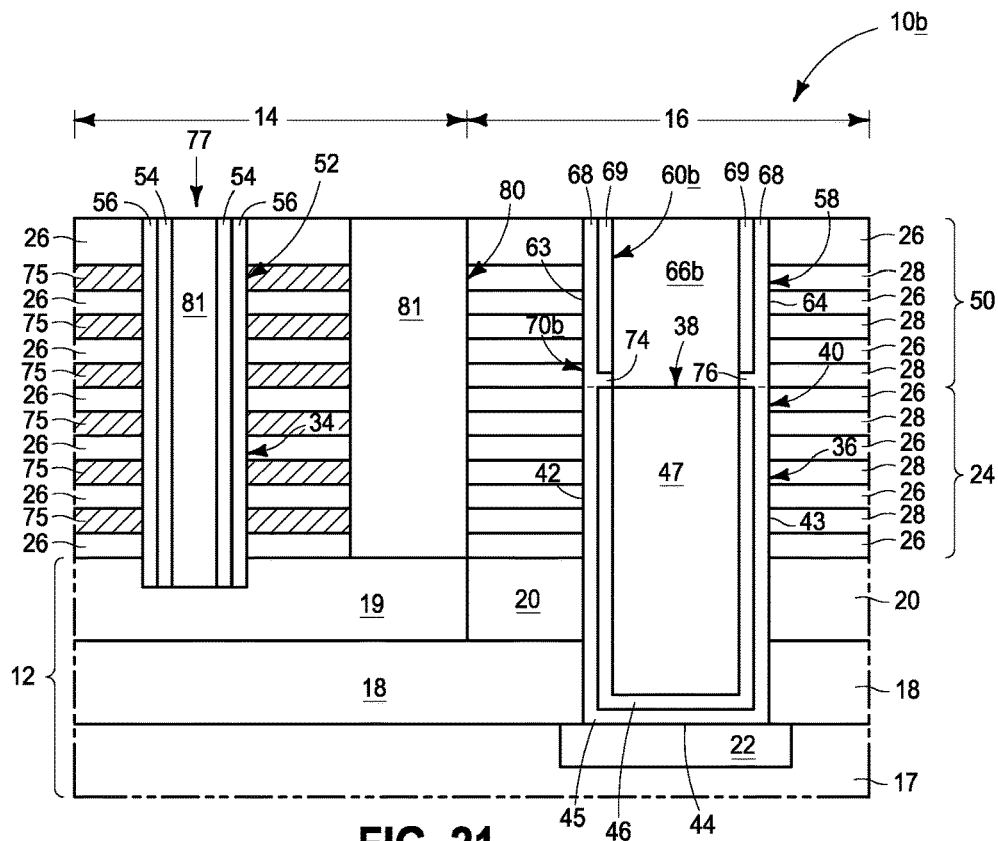
FIG. 21 is a view of the FIG. 15 substrate at a processing step subsequent to that shown by FIG. 15.
Figure 22:
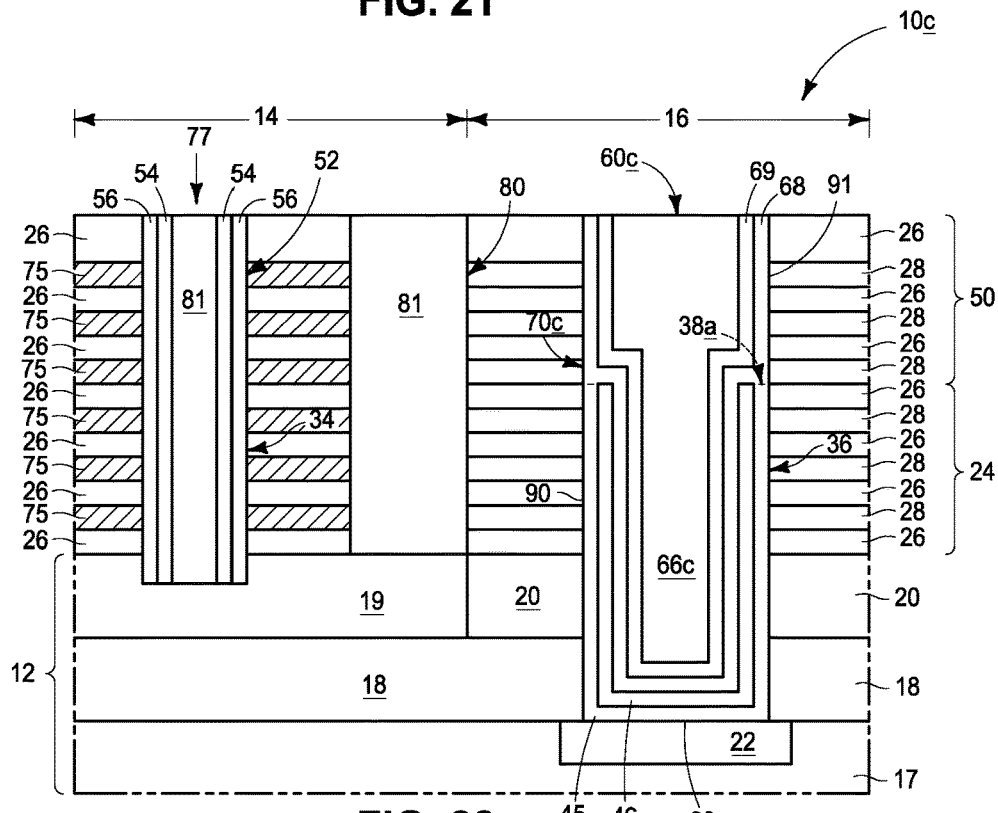
FIG. 22 is a view of the FIG. 18 substrate at a processing step subsequent to that shown by FIG. 18.

FIGS. 20, 21, and 22 show example corresponding constructions with respect to substrate fragments 10*a*, 10*b*, and 10*c*, respectively, as described above.

Embodiments of the invention encompass memory circuitry that comprises a vertical string of memory cells and a conductive via independent of method of manufacture. Nevertheless, any attribute as described above in the method embodiments may be used or found in a construction in the structure embodiments. In one such embodiment, such memory circuitry comprising a vertical string of memory cells and a conductive via (e.g., 70 or 70*a*) comprises a first region (e.g., region 14) of vertically-alternating tiers of insulating material (e.g., 26) and control gate material (e.g., 75), and a second region (e.g., 16) of vertically-alternating tiers of different composition insulating materials (e.g., 26, 28) laterally of the first region. A channel pillar (e.g., 54) extends elevationally through multiple of the vertically-alternating tiers within the first region.

Tunnel insulator, charge storage material, and control gate blocking insulator (e.g., components of material 56) are between the channel pillar and the control gate material of individual of the tiers of the control gate material within the first region. A conductive via (e.g., 70 or 70*a*) extends elevationally through the vertically-alternating tiers in the second region. The conductive via comprises vertically-stacked conductive containers (e.g., 62, 40 or 62*a*, 40*a*) within the alternating tier of the different composition insulating materials in the second region. The conductive containers individually have opposing sidewalls (e.g., 63, 64 or 42, 43) and a base (e.g., 65 or 44) extending there-between in vertical cross-section. The conductive containers individually have conductive fill material therein (e.g., 66, 47 or 66*a*, 47*a*). The base of an upper of the conductive containers (base 65 of upper container 62 or 62*a*) is above an elevationally outermost surface (e.g., 95) of a lower of the conductive containers (e.g., conductive container 40 or 40*a*). In one embodiment, the opposing sidewalls and base of each of the respective individual conductive containers are homogenous. In one embodiment, the opposing sidewalls and base of each of the respective individual conductive containers comprise two different composition conductive materials that are directly against one another. Any other attribute(s) or aspect(s) as shown and/or described above may be used.

In another example embodiment, the conductive via (e.g., 70*b*) comprises a second conductive container (e.g., material 46) inside a first conductive container (e.g., materials 45 and 46) within the alternating tiers of the different composition insulating materials in the second region. The first and second conductive containers individually have opposing sidewalls and a base extending there-between in vertical cross-section. Laterally opposing projections (e.g., 74, 76) project radially inward toward one another elevationally over tops of the second container sidewalls. The projections may be non-conductive (i.e., insulative and/or semi-conductive) or may be conductive. Any other attribute(s) or aspect(s) as shown and/or described above may be used.

In another embodiment, the conductive via (e.g., 70*c*) comprises a conductive container (e.g., comprising materials 45, 46, 68, 69) within the alternating tiers of the different composition insulating materials in the second region. The conductive container has opposing sidewalls (e.g., 90, 91) and a base (e.g., 93) extending there-between in vertical cross-section. Elevationally outermost portions (e.g., within the expanse of material 50) of the opposing sidewalls have respective lateral thickness (e.g., of collective materials 68, 69) that is less than that immediately above the base (e.g., of collective materials 45, 46, 68, 69) in the vertical cross-section. In one embodiment, the lateral thickness of each elevationally outermost portion is no more than half that immediately above the base in the vertical cross-section. Any other attribute(s) or aspect(s) as shown and/or described above may be used.

CONCLUSION

In some embodiments, a method used in forming a vertical string of memory cells and a conductive via comprises forming a first lower opening and a second lower opening into a lower material. A first material is formed within the first and second lower openings. An upper material is formed above the lower material and above the first material in the first and second lower openings. A first upper opening is formed through the upper material to the first material in the first lower opening. At least a majority of the first material is removed from the first lower opening through the first upper opening and channel material is formed within the first lower and first upper openings for the vertical string of memory cells being formed. After forming the channel material, a second upper opening is formed through the upper material to the first material in the second lower opening. Conductive material of the conductive via is formed within the second upper opening.

In some embodiments, memory circuitry comprises a vertical string of memory cells and a conductive via comprising a first region of vertically-alternating tiers of insulative material and control gate material. A second region of vertically-alternating tiers of different composition insulating materials is lateral of the first region. A channel pillar extends elevationally through multiple of the vertically-alternating tiers within the first region. Tunnel insulator, charge storage material, and control gate blocking insulator are between the channel pillar and the control gate material of individual of the tiers of the control gate material within the first region. A conductive via extends elevationally through the vertically-alternating tiers in the second region. The conductive via comprises vertically-stacked conductive containers within the alternating tiers of the different composition insulating materials in the second region. The conductive containers individually have opposing sidewalls and a base extending there-between in vertical cross-section. The conductive containers individually have conductive fill material therein. The base of an upper of the conductive containers is above an elevationally outermost surface of a lower of the conductive containers.

In some embodiments, memory circuitry comprising a vertical string of memory cells and a conductive via comprises a first region of vertically-alternating tiers of insulative material and control gate material. A second region of vertically-alternating tiers of different composition insulating materials is lateral of the first region. A channel pillar extends elevationally through multiple of the vertically-alternating tiers within the first region. Tunnel insulator, charge storage material, and control gate blocking insulator are between the channel pillar and the control gate material of individual of the tiers of the control gate material within the first region. A conductive via extends elevationally through the vertically-alternating tiers in the second region. The conductive via comprises a second conductive container inside a first conductive container within the alternating tiers of the different composition insulating materials in the second region. The first and second conductive containers individually have opposing sidewalls and a base extending there-between in vertical cross-section. Laterally opposing projections project radially inward toward one another elevationally over tops of the second container sidewalls.

In some embodiments, memory circuitry comprises a vertical string of memory cells and a conductive via comprises a first region of vertically-alternating tiers of insulative material and control gate material. A second region of vertically-alternating tiers of different composition insulating materials is lateral of the first region. A channel pillar extends elevationally through multiple of the vertically-alternating tiers within the first region. Tunnel insulator, charge storage material, and control gate blocking insulator are between the channel pillar and the control gate material of individual of the tiers of the control gate material within the first region. A conductive via extends elevationally through the vertically-alternating tiers in the second region. The conductive via comprises a conductive container within the alternating tiers of the different composition insulating materials in the second region. The conductive container has opposing sidewalls and a base extending there-between in vertical cross-section. Elevationally outermost portions of the opposing sidewalls have a respective lateral thickness that is less than that immediately above the base in the vertical cross-section.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a vertical string of memory cells and a conductive via, comprising:
   forming a first lower opening and a second lower opening into a lower material;
   forming a first material within the first and second lower openings;
   forming an upper material above the lower material and above the first material in the first and second lower openings;
   forming a first upper opening through the upper material to the first material in the first lower opening;
   removing at least a majority of the first material from the first lower opening through the first upper opening and forming channel material within the first lower and first upper openings for the vertical string of memory cells being formed;
   after forming the channel material, forming a second upper opening through the upper material to the first material in the second lower opening;
   forming conductive material of the conductive via within the second upper opening;
   the first material being conductive; and
   wherein forming the first material comprises:
      forming a conductive container having opposing sidewalls and a base extending there-between in vertical cross-section in each of the first and second lower openings; and
      forming conductive fill material within each conductive container in each of the first and second lower openings, the conductive fill material being of different composition from that of the opposing sidewalls and base of each conductive container in each of the first and second lower openings.

2. A method used in forming a vertical string of memory cells and a conductive via, comprising:
- forming a first lower opening and a second lower opening into a lower material;
- forming a first material within the first and second lower openings;
- forming an upper material above the lower material and above the first material in the first and second lower openings;
- forming a first upper opening through the upper material to the first material in the first lower opening;
- removing at least a majority of the first material from the first lower opening through the first upper opening and forming channel material within the first lower and first upper openings for the vertical string of memory cells being formed;
- after forming the channel material, forming a second upper opening through the upper material to the first material in the second lower opening;
- forming conductive material of the conductive via within the second upper opening;
- wherein the first material is conductive and said forming of the conductive material within the second upper opening comprises forming a container having opposing sidewalls and a base extending there-between in vertical cross-section in the second upper opening; and further comprising:
  - etching through the base of the container in the second upper opening to expose the first material in the second lower opening; and
  - forming conductor material in the second upper opening directly against the conductive first material of the opposing sidewalls of what was the former container in the second upper opening.

3. The method of claim 2 wherein the first material in the second lower opening comprises a conductive container having opposing sidewalls and a base extending there-between in the vertical cross-section in the second lower opening, the first material comprising conductive fill material within the conductive container in the second lower opening.

4. The method of claim 3 wherein the conductor material is of the same composition as the fill material and is formed directly against the fill material.

5. The method of claim 3 wherein the container and the first material within the second lower opening comprise two different composition materials with each having its own opposing sidewalls and a base extending between its sidewalls in the vertical cross-section.

6. The method of claim 5 wherein the etching to expose the first material in the second lower opening forms laterally opposing projections that project radially inward toward one another elevationally over tops of a radially-inner of the two different composition materials.

7. The method of claim 6 wherein the two laterally opposing projections are conductive.

8. The method of claim 6 wherein the two laterally opposing projections are insulative or semiconductive.

9. A method used in forming a vertical string of memory cells and a conductive via, comprising:
- forming a first lower opening and a second lower opening through a lower material that is above a substrate, and forming the second lower opening deeper than the first lower opening;
- forming a first material within the first and second lower openings;
- forming an upper material above the lower material and above the first material in the first and second lower openings;
- forming a first upper opening through the upper material to the first material in the first lower opening;
- removing at least a majority of the first material from the first lower opening through the first upper opening and forming channel material within the first lower and first upper openings for the vertical string of memory cells being formed;
- after forming the channel material, forming a second upper opening through the upper material to the first material in the second lower opening; and
- forming conductive material of the conductive via within the second upper opening.

10. The method of claim 9 comprising forming the first material within the first and second lower openings in the same processing step.

11. The method of claim 9 comprising forming the second lower opening to have a wider maximum open dimension than the first lower opening.

12. The method of claim 9,
- wherein the forming of each of the first lower opening and the second lower opening through the lower material comprises etching, the forming of the first lower opening and the second lower opening occurring in the same etching step;
- wherein the second lower opening has a wider maximum open dimension than the first lower opening; and
- using the wider maximum open dimension of the second lower opening compared to that of the first lower opening during said same etching step to inherently cause the second lower opening to be deeper than the first lower opening.

* * * * *